(12) United States Patent
Carneiro et al.

(10) Patent No.: US 9,804,382 B1
(45) Date of Patent: Oct. 31, 2017

(54) ELECTROWETTING DISPLAY PIXELS WITH PIXEL WALLS HAVING NON-PLANAR SIDE SURFACES

(71) Applicant: Amazon Technologies, Inc., Reno, NV (US)

(72) Inventors: Steven Ramos Carneiro, Eindhoven (NL); Pavel Novoselov, Eindhoven (NL); Sukhdip Sandhu, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/577,040

(22) Filed: Dec. 19, 2014

(51) Int. Cl.
*G02B 26/00* (2006.01)
*G09G 3/34* (2006.01)
*G03F 7/20* (2006.01)
*G02B 26/04* (2006.01)
*G02B 27/42* (2006.01)
*G02B 26/02* (2006.01)

(52) U.S. Cl.
CPC ........... *G02B 26/005* (2013.01); *G02B 26/04* (2013.01); *G03F 7/20* (2013.01); *G03F 7/2022* (2013.01); *G09G 3/348* (2013.01); *B01L 2400/04* (2013.01); *B01L 2400/0427* (2013.01); *G02B 26/02* (2013.01); *G02B 27/4233* (2013.01); *G09G 3/34* (2013.01)

(58) Field of Classification Search
CPC .... G02B 26/004; G02B 26/005; G02B 26/02; G02B 2207/115; G09G 3/34; G09G 3/3426; G09G 3/348; G09G 5/10; G09G 2300/04; G09G 2300/0404; G09G 2300/08; B01L 2400/04; B01L 2400/0427
USPC ............... 359/290, 291, 295, 245, 228, 253; 345/60, 64, 71, 102, 174
See application file for complete search history.

(56) References Cited

U.S. PATENT DOCUMENTS

| | | | | |
|---|---|---|---|---|
| 7,872,790 | B2 * | 1/2011 | Steckl | G02B 26/004 359/253 |
| 8,077,283 | B2 * | 12/2011 | Van Veenendaal | G02F 1/133377 349/143 |
| 8,241,731 | B2 * | 8/2012 | Ohgaki | G02F 1/167 345/107 |
| 8,723,759 | B2 * | 5/2014 | Parry-Jones | G02B 26/005 345/60 |
| 9,046,682 | B2 * | 6/2015 | Figura | G09G 3/34 |
| 9,348,132 | B1 * | 5/2016 | Novoselov | G02B 26/005 |

* cited by examiner

*Primary Examiner* — Loha Ben
(74) *Attorney, Agent, or Firm* — Brinks Gilson & Lione

(57) ABSTRACT

An electrowetting display device includes a first support plate and a second support plate. A first fluid and a second fluid that is immiscible with the first fluid are between the first support plate and the second support plate. A plurality of pixel walls having concave side surfaces are formed on the first support plate to define a plurality of electrowetting pixels. A pixel electrode is disposed on the first support plate for applying a voltage within each electrowetting pixel to cause relative displacement of the first fluid and the second fluid.

22 Claims, 7 Drawing Sheets

ELECTROWETTING DISPLAY PIXELS WITH PIXEL WALLS HAVING NON-PLANAR SIDE SURFACES

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designing, packaging, and fabricating display devices, as content available for mobile use becomes more extensive and device portability continues to be a high priority.

An electrowetting display includes an array of pixels individually bordered by pixel walls that retain liquid, such as an opaque oil, for example. Light transmission through each pixel is adjustable by electronically controlling a position of the liquid in the pixel. Resolution and quality of an electrowetting display may depend on a number of factors, such as a degree of control of optical transmissivity or reflectivity of material layers of the electrowetting display and pixel size, for example.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1A:
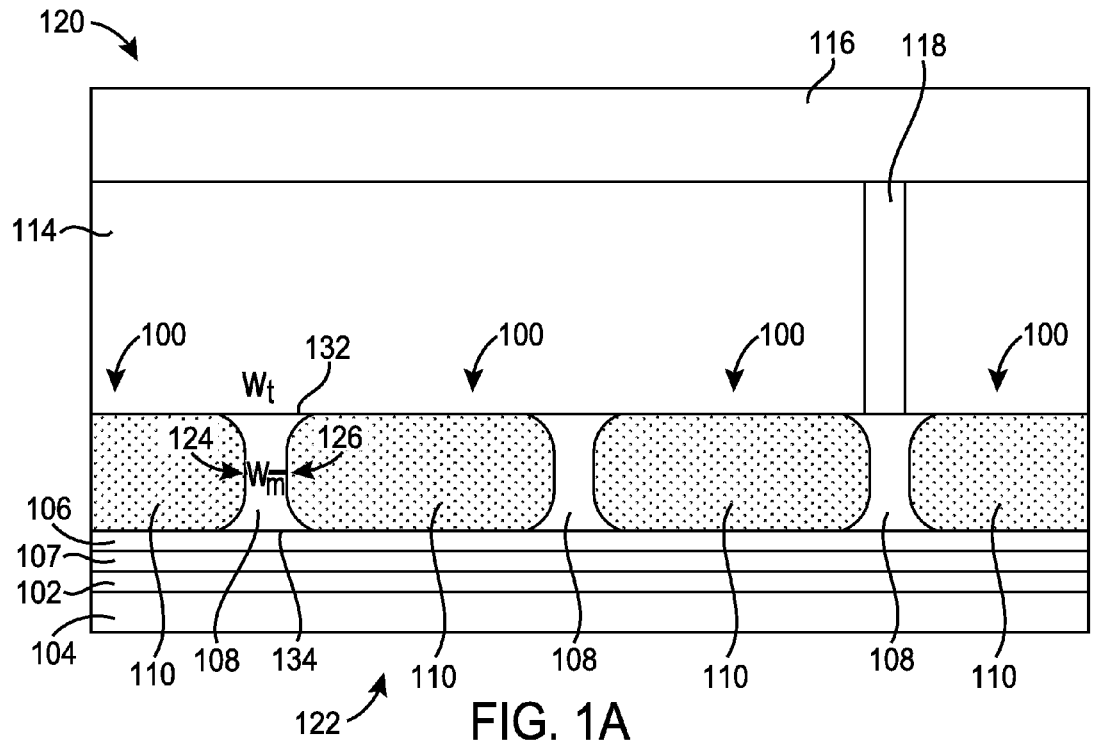
FIGS. 1A and 1B illustrate a cross-section of a portion of an electrowetting display device, according to various embodiments.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like. Various embodiments described herein include techniques for assembling electronic devices including these components for the electrowetting displays and other features described herein.

An electrowetting pixel is defined by a number of pixel walls that surround or are otherwise associated with at least a portion of the electrowetting pixel. The pixel walls form a structure that is configured to contain at least a portion of a first liquid, such as an opaque oil. Light transmission through the electrowetting pixel can then be controlled by the application of an electric potential to the electrowetting pixel, which results in a movement of a second liquid, such as an electrolyte solution, into the electrowetting pixel, thereby displacing the first liquid.

One or more of the pixels walls making up an electrowetting pixel may have non-linear side surfaces, such as by being at least partially concave or otherwise curved. The non-linear side surfaces of the pixel walls can improve control of the first liquid within the electrowetting pixel by controlling the formation of a droplet by the displaced first liquid and enhancing a pinning effect of the second liquid, which both operate to constrain the first fluid within the electrowetting pixel. This can mitigate overflow effects, in which the first fluid flows into neighboring pixels, and may further enable an operation of the electrowetting pixel at a higher electric potential, improving overall performance.

The side surfaces of the pixel walls may have various configurations. In some embodiments, the side surfaces are symmetrical and share the same shape or curvature. In other embodiments, however, the shapes of the side surfaces of a particular pixel wall may be different so that the first and second side surfaces have different configurations. In some embodiments, a first side surface may be planar, while a second side surface is at least partially concave or otherwise curved.

A display device, such as an electrowetting display device, may be a transmissive, reflective or transflective display that generally includes an array of pixels (e.g., which may comprise subpixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) included in each pixel. Transistors take up a relatively small fraction of the area of each pixel to allow light to efficiently pass through (or reflect from) the display pixel. Herein, a pixel may, unless otherwise specified, be made up of two or more subpixels of an electrowetting display device. Such a pixel or subpixel may be the smallest light transmissive, reflective or transflective pixel of a display that is individually operable to directly control an amount of light transmission through or reflection from the pixel. For example, in some embodiments, a pixel may comprise a red subpixel, a green subpixel, and a blue subpixel. In other embodiments, a pixel may be a smallest component, e.g., the pixel does not include any subpixels.

Electrowetting displays include an array of pixels sandwiched between two support plates, such as a bottom support plate and a top support plate. For example, a bottom support plate in cooperation with a top support plate may contain pixels that include electrowetting oil, electrolyte solution and pixel walls between the support plates. Support plates may include glass, plastic (e.g., a transparent thermoplastic such as a poly(methyl methacrylate) (PMMA) or other acrylic), or other transparent material and may be made of a rigid material or a flexible material, for example. Pixels include various layers of materials built upon a bottom support plate. One example layer is an amorphous fluoropolymer (AF) with hydrophobic behavior, around portions of which pixel walls are built.

Hereinafter, example embodiments include, but are not limited to, reflective electrowetting displays that include a clear or transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

In some embodiments, a reflective electrowetting display comprises an array of pixels sandwiched between a bottom support plate and a top support plate. The bottom support plate may be opaque while the top support plate is transparent. Herein, describing a pixel or material as being "transparent" means that the pixel or material may transmit a relatively large fraction of the light incident upon it. For example, a transparent material or layer may transmit more than 70% or 80% of the light impinging on its surface, though claimed subject matter is not limited in this respect.

Pixel walls retain at least a first fluid which is electrically non-conductive, such as an opaque or colored oil, in the individual pixels. A cavity formed between the support plates is filled with the first fluid (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing. The second fluid is immiscible with the first fluid.

Individual reflective electrowetting pixels may include a reflective layer on the bottom support plate of the electrowetting pixel, a transparent electrode layer adjacent to the reflective layer, and a hydrophobic layer on the electrode layer. Pixel walls of each pixel, the hydrophobic layer, and the transparent top support plate at least partially enclose a liquid region that includes an electrolyte solution and an opaque liquid, which is immiscible with the electrolyte solution. An "opaque" liquid, as described herein, is used to describe a liquid that appears black to an observer. For example, an opaque liquid strongly absorbs a broad spectrum of wavelengths (e.g., including those of red, green and blue light) in the visible region of electromagnetic radiation. In some embodiments, the opaque liquid is a nonpolar electrowetting oil.

The opaque liquid is disposed in the liquid region. A coverage area of the opaque liquid on the bottom hydrophobic layer is electrically adjustable to affect the amount of light incident on the reflective electrowetting display that reaches the reflective material at the bottom of each pixel.

In addition to pixels, spacers and edge seals may also be located between the two support plates. The support plates may comprise any of a number of materials, such as plastic, glass, quartz, and semiconducting materials, for example, and claimed subject matter is not limited in this respect.

Spacers and edge seals which mechanically connect the first support plate with the second overlying support plate, or which form a separation between the first support plate and the second support plate, contribute to mechanical integrity of the electrowetting display. Edge seals, for example, being disposed along a periphery of an array of electrowetting pixels, may contribute to retaining fluids (e.g., the first and second fluids) between the first support plate and the second overlying support plate. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
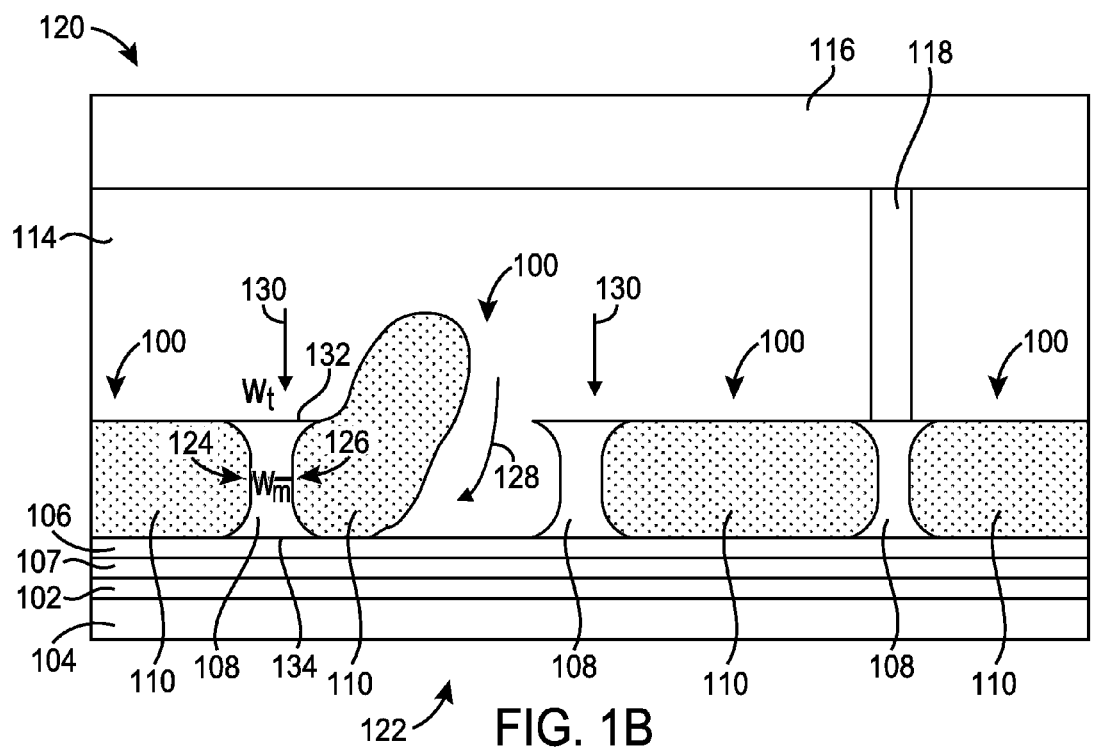
Figure 2:
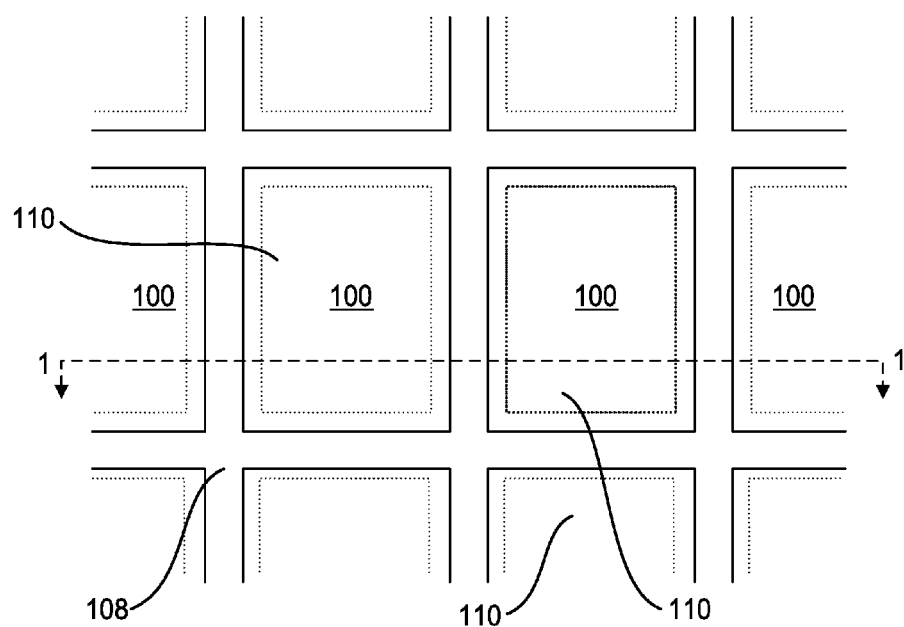
FIG. 2 illustrates a top view of the electrowetting pixels of FIGS. 1A and 1B mostly exposed by an electrowetting fluid, according to various embodiments.

FIG. 1A is a cross-section of a portion of a reflective electrowetting display device illustrating several electrowetting pixels 100 taken along sectional line 1-1 of FIG. 2. FIG. 1B shows the same cross-sectional view as FIG. 1A in which an electric potential has been applied to one of the electrowetting pixels 100 causing displacement of a first fluid disposed therein, as described below. FIG. 2 shows a top view of electrowetting pixels 100 formed over a bottom support plate 104.

In FIGS. 1A and 1B, two complete electrowetting pixels 100 and two partial electrowetting pixels 100 are illustrated. An electrowetting display device may include any number (usually a very large number, such as thousands or millions) of electrowetting pixels 100. An electrode layer 102 is formed on a bottom support plate 104.

In various embodiments, electrode layer 102 may be connected to any number of transistors, such as thin film transistors (TFTs) (not shown), that are switched to either select or deselect electrowetting pixels 100 using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example.

In some embodiments, dielectric barrier layer 107 may at least partially separate electrode layer 102 from a hydrophobic layer 106, such as an amorphous fluoropolymer layer for example, also formed on bottom support plate 104. Such separation may, among other things, prevent electrolysis occurring through hydrophobic layer 106. Barrier layer 107 may be formed from various materials including organic/inorganic multilayer stacks or silicon dioxide ($SiO_2$) and polyimide layers. When constructed using a combination of $SiO_2$ and polyimide layers, the $SiO_2$ layer may have a thickness of 200 nanometers and a dielectric constant of 3.9, while the polyimide layer may have a thickness of 105 nanometers and a dielectric constant of 2.9. In some embodiments, hydrophobic layer 106 is an amorphous fluoropolymer layer including any suitable fluoropolymer(s), such as AF1600, produced by DuPont, based in Wilmington, Del. Hydrophobic layer 106 may also include suitable materials that affect wettability of an adjacent material, for example.

Pixel walls 108 form a patterned electrowetting pixel grid on hydrophobic layer 106. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

A first fluid 110, which may have a thickness (e.g., a depth) in a range of about 1 to 10 micrometers, for example, overlays hydrophobic layer 106. First fluid 110 is partitioned by pixel walls 108 of the patterned electrowetting pixel grid. A second fluid 114, such as an electrolyte solution, overlays first fluid 110 and pixel walls 108 of the patterned electrowetting pixel grid. Second fluid 114 may be electrically conductive and/or polar. For example, second fluid 114 may be, for example, a water solution or a salt solution such as potassium chloride water. First fluid 110 is immiscible with second fluid 114.

A support plate 116 covers second fluid 114 and spacer 118 to maintain second fluid 114 over the electrowetting pixel array. In one embodiment, spacer 118 extends to support plate 116 and may rest upon a top surface of one of the pixel walls 108. In alternative embodiments, spacer 118 does not rest on pixel wall 108 but is substantially aligned with pixel wall 108. This arrangement may allow spacer 118 to come into contact with pixel wall 108 upon a sufficient pressure or force being applied to support plate 116. Multiple spacers 118 may be interspersed throughout the array of pixels 100. Support plate 116 may be made of glass or polymer and may be rigid or flexible, for example. In some embodiments, TFTs are fabricated onto support plate 116.

A voltage applied across, among other things, second fluid 114 and electrode layer 102 of individual electrowetting pixels may control transmittance or reflectance of the individual electrowetting pixels.

The reflective electrowetting display device has a viewing side 120 on which an image formed by the electrowetting display device may be viewed, and an opposing rear side 122. Support plate 116 faces viewing side 120 and bottom support plate 104 faces rear side 122. The reflective electrowetting display device may be a segmented display type in which the image is built of segments. The segments may be switched simultaneously or separately. Each segment includes one electrowetting pixel 100 or a number of electrowetting pixels 100 that may be neighboring or distant from one another. Electrowetting pixels 100 included in one segment are switched simultaneously, for example. The electrowetting display device may also be an active matrix driven display type or a passive matrix driven display, for example.

As mentioned above, second fluid 114 is immiscible with first fluid 110. Herein, substances are immiscible with one another if the substances do not substantially form a solution. Second fluid 114 is electrically conductive and/or polar, and may be water or a salt solution such as a solution of potassium chloride in a mixture of water and ethyl alcohol, for example. In certain embodiments, second fluid 114 is transparent, but may be colored or absorbing. First fluid 110 is electrically non-conductive and may for instance be an alkane like hexadecane or (silicone) oil.

Hydrophobic layer 106 is arranged on bottom support plate 104 to create an electrowetting surface area. The hydrophobic character of hydrophobic layer 106 causes first fluid 110 to adhere preferentially to hydrophobic layer 106 because first fluid 110 has a higher wettability with respect to the surface of hydrophobic layer 106 than second fluid 114 in the absence of a voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

First fluid 110 absorbs light within at least a portion of the optical spectrum. First fluid 110 may be transmissive for light within a portion of the optical spectrum, forming a color filter. For this purpose, the fluid may be colored by addition of pigment particles or dye, for example. Alternatively, first fluid 110 may be black (e.g., absorbing substantially all light within the optical spectrum) or reflecting. Hydrophobic layer 106 may be transparent or reflective. A reflective layer may reflect light within the entire visible spectrum, making the layer appear white, or reflect a portion of light within the visible spectrum, making the layer have a color.

As illustrated in FIGS. 1A and 1B, pixel walls 108 have concave side surfaces 124 and 126. Side surfaces 124 and 126 are generally curvilinear and are made up of smooth curved surfaces. Side surfaces 124 and 126 having the profiles depicted in FIGS. 1A and 1B extend along all or a portion of a length of pixel walls 108. In one embodiment, the curvature of side surfaces 124 and 126 is selected so that side surfaces 124 and 126 represent about a 30 degree arc, though other curvatures may be utilized in accordance with the present disclosure.

In one embodiment, a width of pixel wall 108 at a midpoint ($w_m$) between top surface 132 of pixel wall 108 and a bottom surface 134 of pixel wall 108 is between 1 and 2 micrometers, while a width of pixel wall 108 at top surface 132 and the bottom surface 134 ($w_t$) is between 2 and 6 micrometers. Note that slight variations in these dimensions and other dimensions presented in the present disclosure are considered to be within workable examples of the present pixel wall design. In this embodiment, the width of pixel wall 108 at the midpoint $w_m$ is approximately that of a conventional rectangular pixel wall, while the width of pixel wall 108 at top surface 132 is 2 to 3 times that of a conventional rectangular pixel wall. In certain embodiments, the height of pixels wall 108 is 1 micrometer to 6 micrometers, and, in particular embodiments, the height of pixel walls 108 is 2 micrometers to 3.5 micrometers.

If a voltage is applied across an electrowetting pixel 100, electrowetting pixel 100 will enter into an active state. Electrostatic forces will move second fluid 114 toward electrode layer 102 as hydrophobic layer 106 formed within the active electrowetting pixel 100 becomes hydrophilic, thereby displacing first fluid 110 from that area of hydrophobic layer 106 to pixel walls 108 surrounding the area of hydrophobic layer 106, to a droplet-like form. Such displacing action uncovers first fluid 110 from the surface of hydrophobic layer 106 of electrowetting pixel 100.

FIG. 1B shows one of electrowetting pixels 100 in an active state. With an electric potential applied to electrode layer 102 underneath the activated electrowetting pixel 100, second fluid 114 is attracted towards electrode layer 102 displacing first fluid 110 within the activated electrowetting pixel 100.

As second fluid 114 moves into the activated electrowetting pixel 100 (as illustrated by arrows 128), first fluid 110 is displaced and moves into the recessed portion of the pixel wall 108 defined by side surface 126. First fluid 110 forms into a droplet against the concave surface of side surface 126 of the pixel wall 108. As the droplet forms against the concave surface of side surface 126, the droplet is oriented by the upper portion of side surface 126 to project away from pixel wall 108. This orientation of the droplet of first fluid 110 distances first fluid 110 away from the top surface of pixel wall 108 thereby reducing an amount of first fluid 110 that forms over the top surface of pixel wall 108.

To further enhance this effect, in certain embodiments pixel walls 108 are treated to be hydrophilic and, as such, pixel walls 108 attract second fluid 114. This results in a phenomena referred to as electrolyte pinning in which second fluid 114 is attracted to the top surfaces of pixel walls 108 (as illustrated by arrow 130). This attraction of second fluid 114 to the top surfaces of pixel walls 108 serves to further constrain first fluid 110 to the individual electrowetting pixels 100 and can contribute to the minimization of overflow effects in which first fluid 110 moves from one electrowetting pixel 100 over one of its defining pixel walls 108 and into a second, adjacent electrowetting pixel 100.

The strength of the electrolyte pinning effect is directly proportional to the surface area of the top surface of pixel walls 108. As described above, the curvature of side surfaces 124 and 126 results in a width of pixel wall 108 at the top surface ($w_t$) that is increased over some conventional pixel walls, thereby increasing the strength of the electrolyte pinning effect.

The combination of these factors—namely, the concave curvature of side surfaces 124 and 126 of pixel walls 108, as well as the increased width $w_t$ of pixel wall 108 at the top surface operate in conjunction to confine first fluid 110 within each electrowetting pixel 100.

Because the first fluid 110 can be more effectively constrained within each electrowetting pixel 100, electrowetting pixels 100 can be activated using higher voltages than conventional electrowetting pixels, without causing overflow. By using higher voltages in the present electrowetting pixel 100, the present electrowetting pixel 100 can provide better control of the movement of first fluid 110 within each electrowetting pixel 100, leading to a larger grayscale range for the present electrowetting pixel 100. Additionally, because at higher voltages first fluid 110 stands taller and at least some of first fluid 110 is contained within the recessed portion of pixel wall 108, first fluid 110 covers a smaller surface area of electrowetting pixel 100 providing an increase in white area displayed when electrowetting pixel 100 is subjected to a maximum voltage. In some embodiments, the maximum voltage at which the present electrowetting pixel 100 may be exposed before first fluid 110 overflows into surrounding electrowetting pixels can exceed 25 volts.

Of potentially additional benefit, given the wider top surface ($w_t$) of pixel walls 108, when constructing a display device incorporating electrowetting pixels 100, it may be easier to position support plate 116 so that spacers 118 are correctly seated upon pixel walls 108. This is because the wider top surface $w_t$ provides a wider margin for error should spacers 118 not be precisely positioned over a center of pixel walls 108.

After activation, when the voltage across electrowetting pixel 100 is returned to an inactive signal level of zero or a value near to zero, electrowetting pixel 100 will return to an inactive state, where first fluid 110 flows back to cover hydrophobic layer 106. In this way, first fluid 110 forms an electrically controllable optical switch in each electrowetting pixel 100.

FIGS. 1A and 1B illustrate one embodiment of pixel walls 108 with side surfaces 124 and 126 having a first shape. In other embodiments, however, different side surfaces having different shapes may be utilized. For example, FIG. 3 is a cross-section of a portion of a reflective electrowetting display device illustrating several electrowetting pixels 100 having pixel walls with a second configuration.

Figure 3:
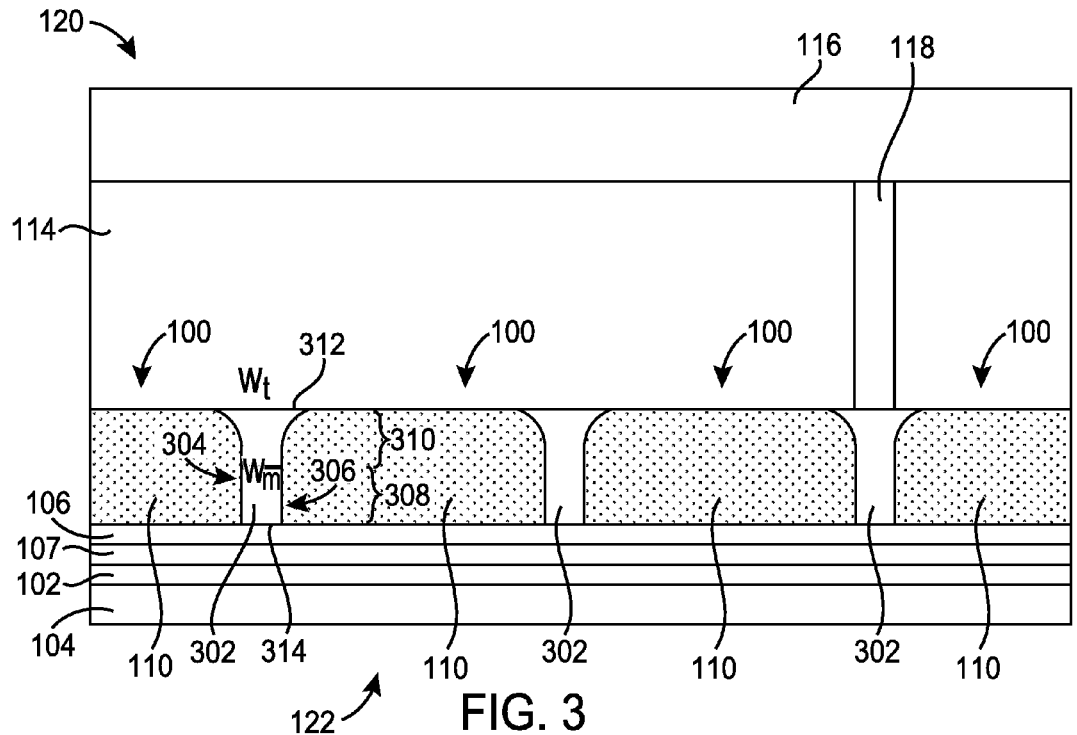
FIG. 3 illustrates a cross-section of a portion of an electrowetting display device illustrating an alternative pixel wall embodiment.

In FIG. 3 two complete electrowetting pixels 100 and two partial electrowetting pixels 100 are illustrated. Electrowetting pixels 100 are configured in the same manner as electrowetting pixels 100 of FIGS. 1A and 1B where the same reference numbers refer to like or identical components.

Referring to FIG. 3, pixel walls 302 include side surfaces 304 and 306. As illustrated, a lower portion 308, such as a bottom half, of pixel wall 302 includes regions of side surfaces 304 and 306 that are substantially planar and formed perpendicularly to bottom support plate 104. However, an upper portion 310, such as a top half, of pixel wall 302 includes regions of side surfaces 304 and 306 that are curved.

In one embodiment, a width of pixel wall 302 at a midpoint between a top surface 312 of pixel wall 302 and a bottom surface 314 of pixel wall 302 ($w_m$) is between 1 and 2 micrometers, while a width of pixel wall 302 at top surface 312 ($w_t$) is between 2 and 6 micrometers. In such an embodiment, the width of pixel wall 302 at the midpoint $w_m$ is approximately that of a conventional rectangular pixel wall, while the width of pixel wall 302 at top surface 312 is 2 to 3 times that of a conventional rectangular pixel wall. The height of pixels walls 302 may be between 2-6 micrometers.

The curvature of the curved regions of side surfaces 304 and 306 may be selected so that the curved regions of side surfaces 304 and 306 represent a 15 degree arc in one embodiment, though other curvatures may be utilized in accordance with the present disclosure. For example, in certain embodiments, the curvature is selected so that the curved regions of side surfaces 304 and 306 represent an arc of 5 degrees to 30 degrees. Further, in certain embodiments, the curvature is not constant and/or different pixel walls 302 may have different curvatures.

The example pixel wall configuration illustrated in FIGS. 1A and 1B and FIG. 3 show symmetrical pixel walls in which the first and second side surfaces are similarly shaped about a plane oriented along a length of the pixel walls. In various other embodiments, however, non-symmetrical pixel walls may be fabricated in accordance with the present disclosure. For example, FIG. 4 shows a number of pixel walls 402 and 404 having non-symmetrical side surface configurations.

Figure 4:
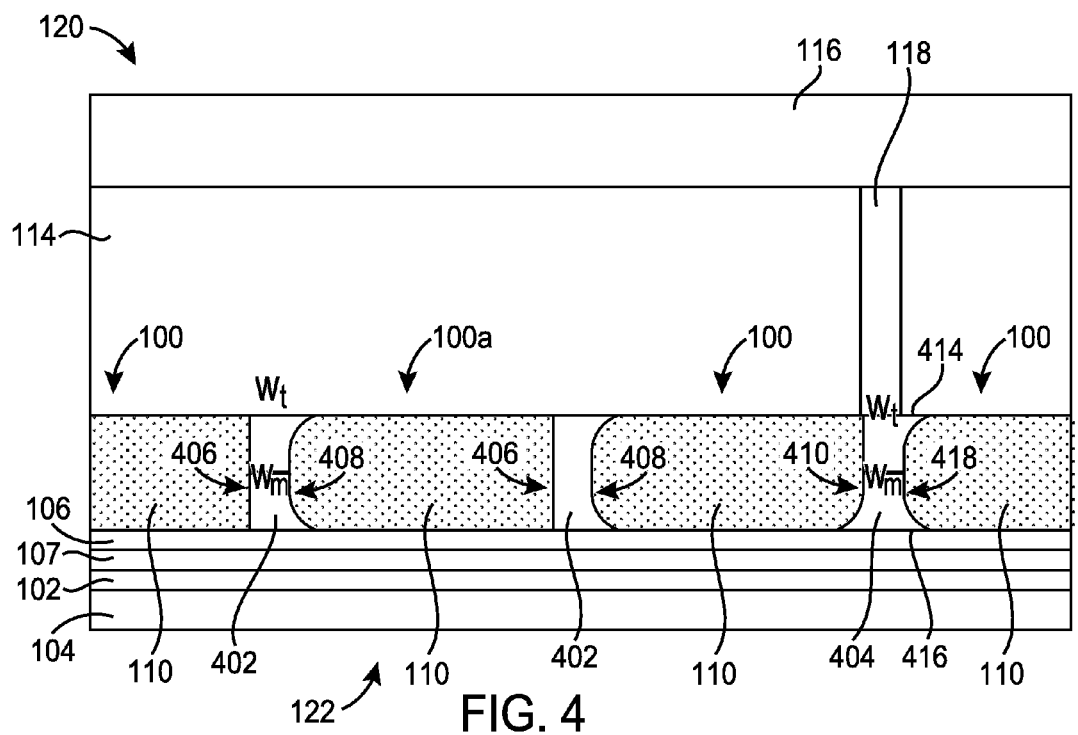
FIG. 4 illustrates a cross-section of a portion of an electrowetting display device illustrating further alternative pixel wall embodiments.

In FIG. 4 two complete electrowetting pixels 100 and two partial electrowetting pixels 100 are illustrated. Electrowetting pixels 100 are configured in the same manner as electrowetting pixels 100 of FIGS. 1A and 1B where the same reference numbers refer to like or identical components.

With reference to FIG. 4, each pixel wall 402 includes a first side surface 406 that is substantially planar. Side surface 408 of each pixel wall 402, however, is generally curvilinear and includes smooth curved surfaces. In one embodiment, the curvature of side surface 408 is selected so that side surface 408 represents a 30 degree arc, though other curvatures may be utilized in accordance with the present disclosure.

The non-symmetrical pixel wall 402 configuration depicted in FIG. 3 may, in some embodiments, improve control of first fluid 110 within electrowetting pixel 100 upon the application of an electric potential to electrowetting pixel 100. More specifically, with reference to electrowetting pixel 100a shown in FIG. 4, for example, upon the application of an electric potential, second fluid 114 will begin to enter electrowetting pixel 100a, displacing first fluid 110 therein. Because of the greater surface area of the curved side surface 408 as compared to the straight side surface 406, the first fluid 110 may have a greater affinity to side surface 408 and a weaker affinity to side surface 406. This can operate to facilitate the entry of second fluid 114 into electrowetting pixel 100a at side surface 406 forcing first fluid 110 away from side surface 406 and towards side surface 408. This, therefore, may not only facilitate the introduction of second fluid 114 into the electrowetting pixel 100a, but also may ensure that when an electric potential is applied to electrowetting pixel 100a, first fluid 110 will predictably move towards surface 408.

Pixel wall 404 shown in FIG. 4 depicts yet another embodiment of a pixel wall having one or more curved side surfaces. As illustrated, an upper portion, such as an upper half, of side surface 410 of pixel wall 404 is substantially planar and formed perpendicularly to bottom support plate 104 and a bottom portion, such as a bottom half, of side surface 410 of pixel wall 404 is curved. Because the electric field is constant over the pixel region, with pixel wall 406 having a curvature at the bottom portion, a thinner layer of oil results at the interface with pixel wall 406, less force is required for second fluid 114 to penetrate first fluid 110 at this interface allowing second fluid 114 to more easily displace first fluid 110 away from surface 410 of pixel wall 404, again providing improved motion control of first fluid 110. Side surface 418 of pixel wall 404 is concave and generally curvilinear.

In one embodiment, the curvature of the curved region of side surface 410 may be selected so that the curved regions of side surface 410 represents a 15 degree arc, and/or the curvature of side surface 408 can be selected so that side surface 408 represents a 30 degree arc, though other curvatures may be utilized in accordance with the present disclosure.

In one embodiment, a width of pixel wall 404 at a midpoint between top surface 414 of pixel wall 404 and a bottom surface 416 of pixel wall 404 ($w_m$) is between 1 and 2 micrometers, while a width of pixel wall 404 at bottom surface 416 is between 1 micrometer and 8 micrometers and, in particular embodiments, a width of pixel wall 404 at bottom surface 416 is between 3 micrometers and 6 micrometers.

A number of different pixel wall configurations are described herein where the pixel walls have one or more side surfaces that may include one or more curved recessed portions or other combinations of curved and planar regions. For a given electrowetting pixel, a number of different side surface configurations may be used for the pixel walls defining the electrowetting pixel.

For example, for a generally rectangular electrowetting pixel having four pixel walls defining the pixel, the pixel wall side surfaces facing the pixel may each share the same or similar side surface configuration, or one or more of the side surfaces may have different configurations.

In one example electrowetting pixel only a single side surface of a defining pixel wall may have a concave surface (see, for example, side surface 408 in FIG. 4), while the three remaining side surfaces may have substantially planar side surfaces (see, for example, side surface 406 of FIG. 4) or, alternatively, only curved lower portions, but planar upper portions (see, for example, side surface 410 of FIG. 4). Such an arrangement may facilitate control of the first fluid (e.g., oil) disposed within the electrowetting pixel and, more specifically, to provide that when the electrowetting pixel is activated the first fluid moves towards the pixel wall having the concave surface.

In the present disclosure, a number of different pixel wall configurations having curved structures are described. It should be understood that due to various manufacturing process limitations, when fabricated, the curved structures of the pixels may not be perfectly smooth. Instead, the curved portions may include a number of steps or edges that are a result of limitations in the fabrication process.

The curved structures of the pixel walls in the present disclosure may be formed using any suitable fabrication process. In one embodiment, during fabrication of the electrowetting display device, lithography employing diffractive grayscale masks can be utilized to form the curved surfaces of the pixels.

Figure 5:
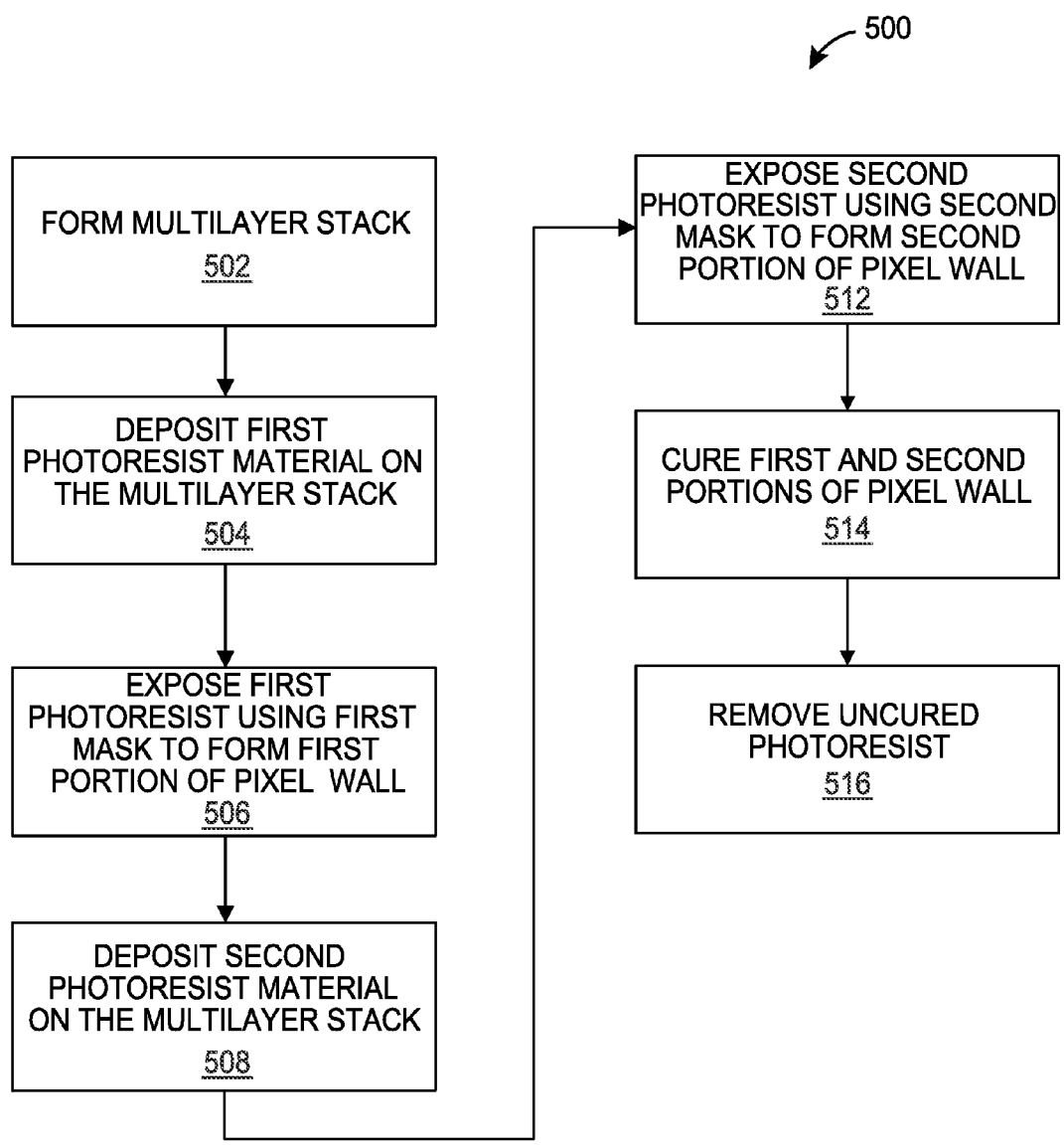
FIG. 5 is a flow diagram of a process for fabricating an electrowetting display device, according to various embodiments.

FIG. 5 is a flow diagram of a process 500 for fabricating an electrowetting display device, according to various embodiments. For example, the display device may employ a pixel wall configuration such as that illustrated in FIGS. 1A and 1B. Though claimed subject matter is not limited in this respect, process 500 may be performed manually (e.g., by humans) and/or using automatic equipment. At block 502, a multilayer stack is first formed. The multilayer stack includes a first conductive layer deposited on a first support plate. In one embodiment, the first conductive layer is indium tin oxide (ITO), although in alternative embodiments the first conductive layer may be another suitable material. Deposition techniques include, for example, chemical vapor deposition (CVD), physical vapor deposition (PVD), molecular beam epitaxy (MBE), and sputtering. The first support plate may be the same as or similar to support plate 104 illustrated in FIG. 1.

The multilayer stack includes a first dielectric layer deposited on the first conductive layer. The first dielectric layer may comprise SiN, SiON, SiO, or TaO, for example. Any suitable deposition technique may be used, such as CVD, PVD, MBE, and a sputtering, for example. A hydrophobic layer (e.g., hydrophobic layer 106, illustrated in FIG. 1) may be deposited over the patterned first dielectric layer.

Figure 6A:
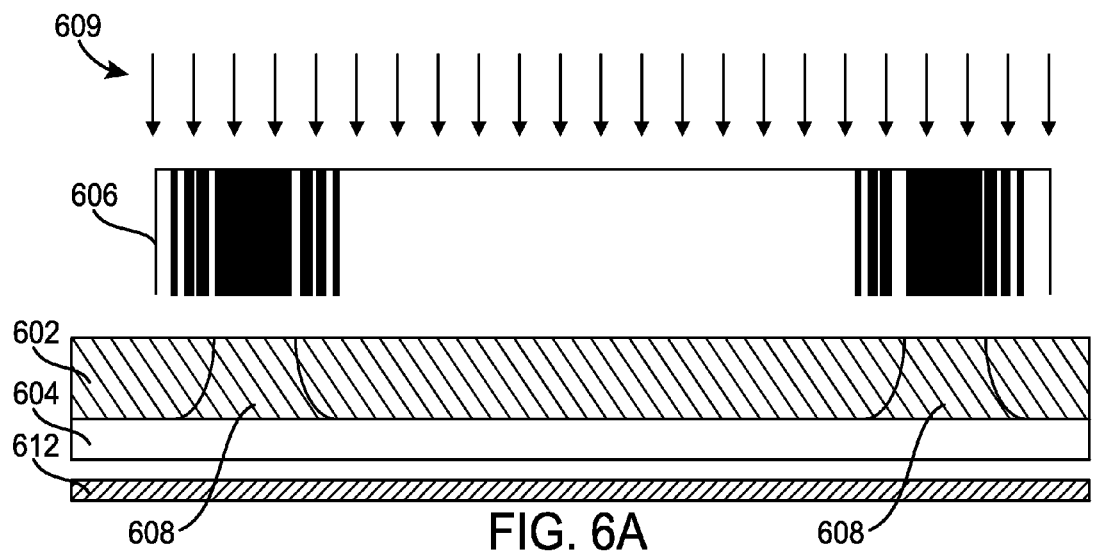
FIGS. 6A and 6B illustrate cross-sectional views of an electrowetting display device during steps of the fabrication process of FIG. 5.

At block 504, a first photoresist material is deposited over the multilayer stack and at block 506 the first photoresist material is exposed to a first diffractive dark field mask to form a first portion of a pixel wall. During performance of block 512, a reflective surface may be positioned behind the multilayer stack. FIG. 6A is a cross-sectional view of an electrowetting display device that illustrates this fabrication step in more detail. As illustrated in FIG. 6A, first photoresist material 602 is deposited over multilayer stack 604. Reflective surface 612 is positioned behind multilayer stack 604. Reflection off reflective surface 612 of the chuck can be utilized to assist or aid in the formation of the curvature of pixel walls during the exposure step in this process due to a portion of the light reflecting off the reflective surface becoming incident on the pixel walls and consequently exposing them. Once first photoresist material 602 is deposited, a first diffractive mask 606, such as a dark field diffractive mask, is positioned over first photoresist material 602 and first photoresist material 602 is exposed to light 609 through first diffractive mask 606. In alternative embodiments, these structures may be printed using suitable methods other than photolithography, including, without limitation, direct writing and electron beam lithography (EBL).

First diffractive mask 606 is generally transparent, but includes a pattern of non-transparent material or lines. In certain embodiments, regions of the mask may be intentionally less transparent to facilitate achieving a similar effect, e.g., grayscale masks. The non-transparent lines are of varying pitch and width and cause the light passing through the first diffractive mask 606 to cure first photoresist material 602 into a curved shape forming a first portion 608 of a pixel wall.

Figure 6B:
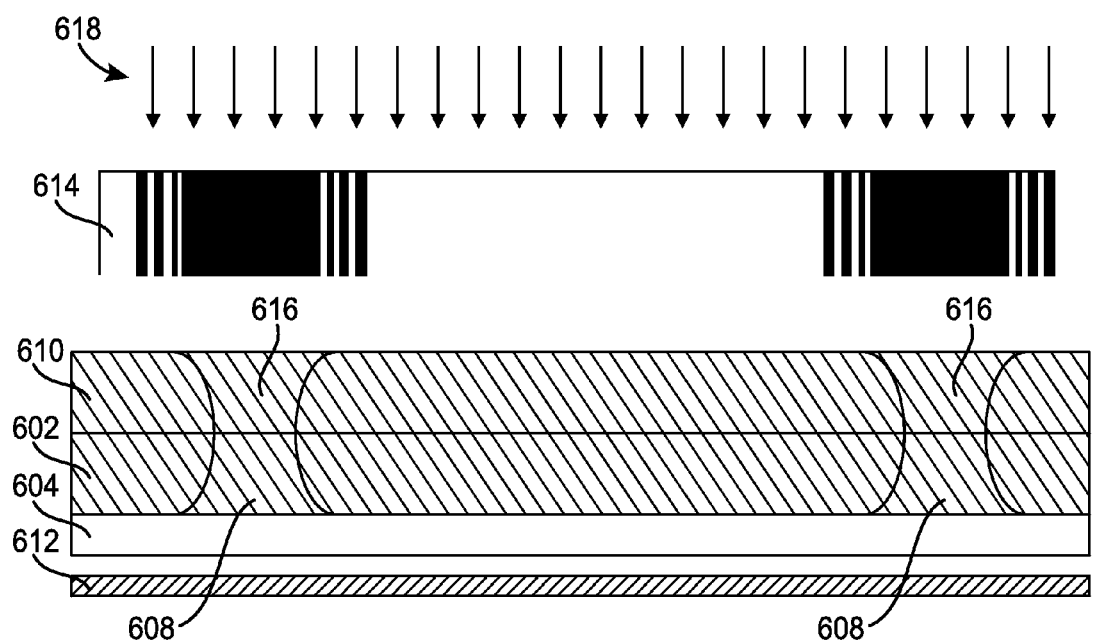

Returning to FIG. 5, at block 508, a second photoresist material is deposited over the multilayer stack. At block 512 the second photoresist material is exposed to a second diffractive dark field mask to form a second portion of a pixel wall. During performance of block 512, a reflective surface can be positioned behind the multilayer stack. FIG. 6B shows the structure of FIG. 6A following the execution of blocks 508, 510, and 512. As shown in FIG. 6B, second photoresist material 610 is deposited over multilayer stack 604. Reflective surface 612 is positioned behind multilayer stack 604. Reflection off reflective surface 612 of the chuck can be utilized to assist or aid in the formation of the curvature of pixel walls during the exposure step in this process due to a portion of the light reflecting off the reflective surface becoming incident on the pixel walls and consequently exposing them. After second photoresist material 610 is deposited, a second diffractive mask 614, such as a dark field diffractive mask, is positioned over second photoresist material 610 and second photoresist material 610 is exposed to light 618 through second diffractive mask 614.

Second diffractive mask 614 is generally transparent, but includes a pattern of non-transparent material or lines. The non-transparent lines are of varying pitch and width and cause the light passing through second diffractive mask 614 to cure second photoresist material 610 into a curved shape forming a second portion 616 of the pixel wall.

Returning to FIG. 5, at block 514 the first and second portions of the pixel are cured and the first and second portions fuse together. At block 516, the uncured portions of the photoresist material (which may include portions of both the first and second photoresist material) are removed to leave the first and second portions of the pixel wall. The photoresist material may comprise, for example, epoxy-based negative photoresist SU-8.

Following formation of the pixel walls, a reflow process may be utilized to modify the hydrophobicity of the hydrophobic layer before an ultraviolet (UV) ozone process is utilized to make the pixel walls hydrophilic. The dosing used during the UV ozone processing is determined by the shape and size of the pixel walls. The hydrophilic nature of the walls following UV ozone processing results in the electrolyte pinning effect described above. After UV ozone processing, the first and second liquids (e.g., the oil and electrolyte solution) can be disposed within the electrowetting pixels of the electrowetting display device. The device can then be capped by a second support plate.

In accordance with the present disclosure, the pixel wall side surfaces may be formed with a variety of surface contours so that the opposing side surfaces of the pixel walls may each have different shapes. Additionally, the side surfaces themselves may have non-consistent curvature. Some side surface configuration may include combinations of curved and planar surfaces.

Figure 7A:
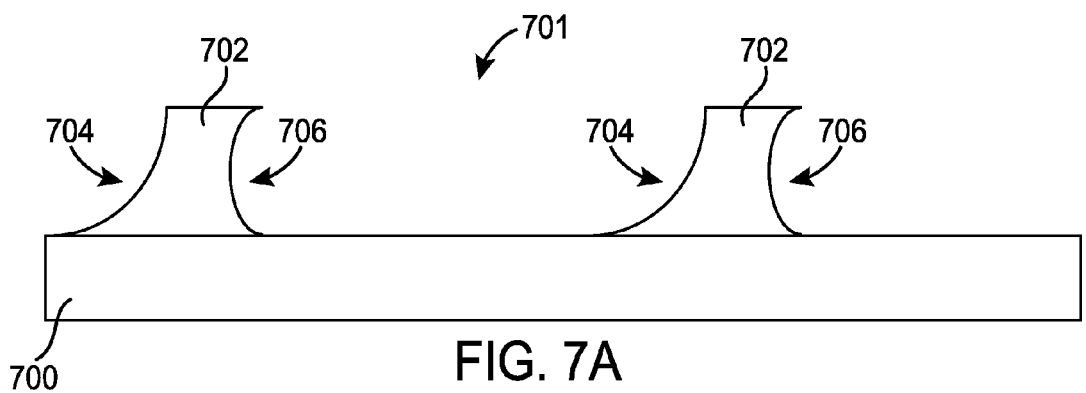
FIGS. 7A-7C illustrate a number of alternative pixel wall embodiments.
Figure 7B:
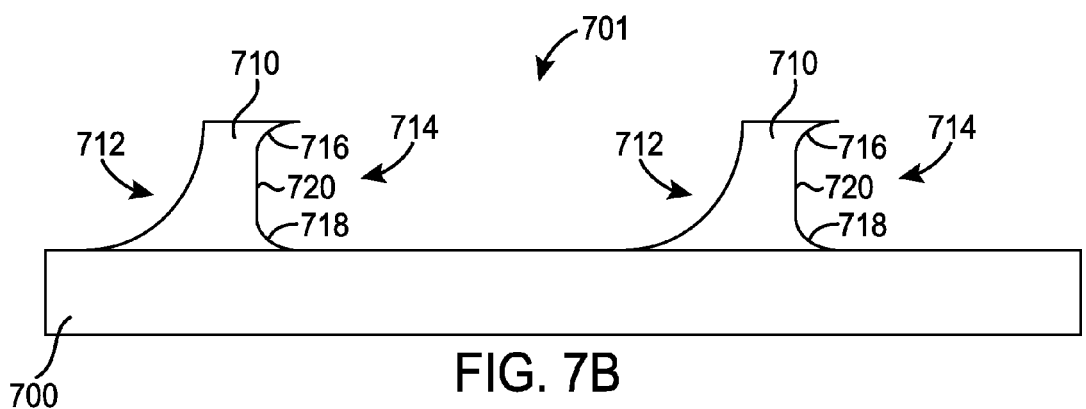
Figure 7C:
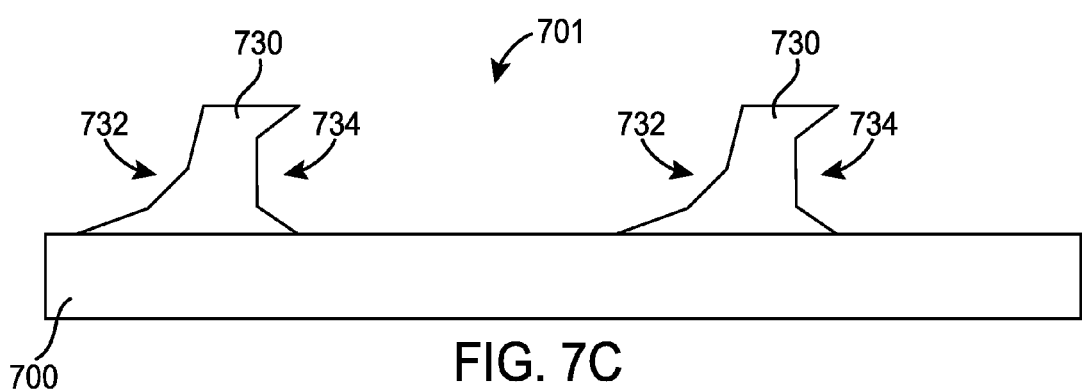

To illustrate, FIGS. 7A-7C illustrate a number of alternative pixel wall embodiments showing various side surface configurations. FIGS. 7A-7C show the pixel walls formed over a bottom support plate 700 where additional elements of the electrowetting pixels, such as an electrode layer, hydrophobic layer, first and second fluids, and top support plate are not shown so as to simplify the illustrations.

Referring to FIG. 7A, pixel walls 702 include side surfaces 704 and 706 and at least partially define electrowetting pixel 701. Side surface 704 is configured so that a lower portion of the side surface 704 extends into an interior volume of electrowetting pixel 701. By extending into electrowetting pixel 701, as discussed above, side surface 704 may operate to reduce a depth of an oil in electrowetting pixel 701 at the interface with side surface 704 of pixel wall 702. That reduced depth can thereby reduce an amount of force required to displace the oil, facilitating movement of the oil away from side surface 704 providing improved oil movement control.

Side surface 706 is differently shaped from side surface 704. The curvature of side surface 706 is such that side surface 706 does not protrude into electrowetting pixel 701.

FIG. 7B shows an alternative pixel wall 710 configuration. Pixel walls 710 include side surfaces 712 and 714. As illustrated, side surfaces 712 are similarly configured to side surface 704 of FIG. 7A. Side surfaces 714, however, are made up of three sections. A top section 716 and bottom section 718 of side surface 714 are curved, while a middle section 720 is planar.

In some cases, it may be undesirable or difficult to form pixel walls with curved surfaces, wherein the curvature of the side surfaces is smooth and well formed. In that case, pixel walls may be fabricated where a number of planar sections are utilized to approximate a desired side surface curvature. FIG. 7C, for example, shows pixel walls 730 having side surfaces 732 and 734. Side surface 732 and 734 each include a number of planar sections, where the planar sections are arranged to approximate a desired curvature. In FIG. 7C, the planar portions are arranged to approximate the side surface curvature illustrated in FIG. 7A.

In various embodiments of the present pixel wall design, various combinations of curved side surfaces may be utilized. A particular electrowetting display device, for example, may include pixel walls having symmetrical side surfaces or differently-configured side surfaces. The side surfaces may have varying curvatures, or combinations of curved and planar surfaces. All pixel walls in the device may have the same configuration, or different pixel walls, or sections of the various pixel walls, may have different configurations.

Figure 8:
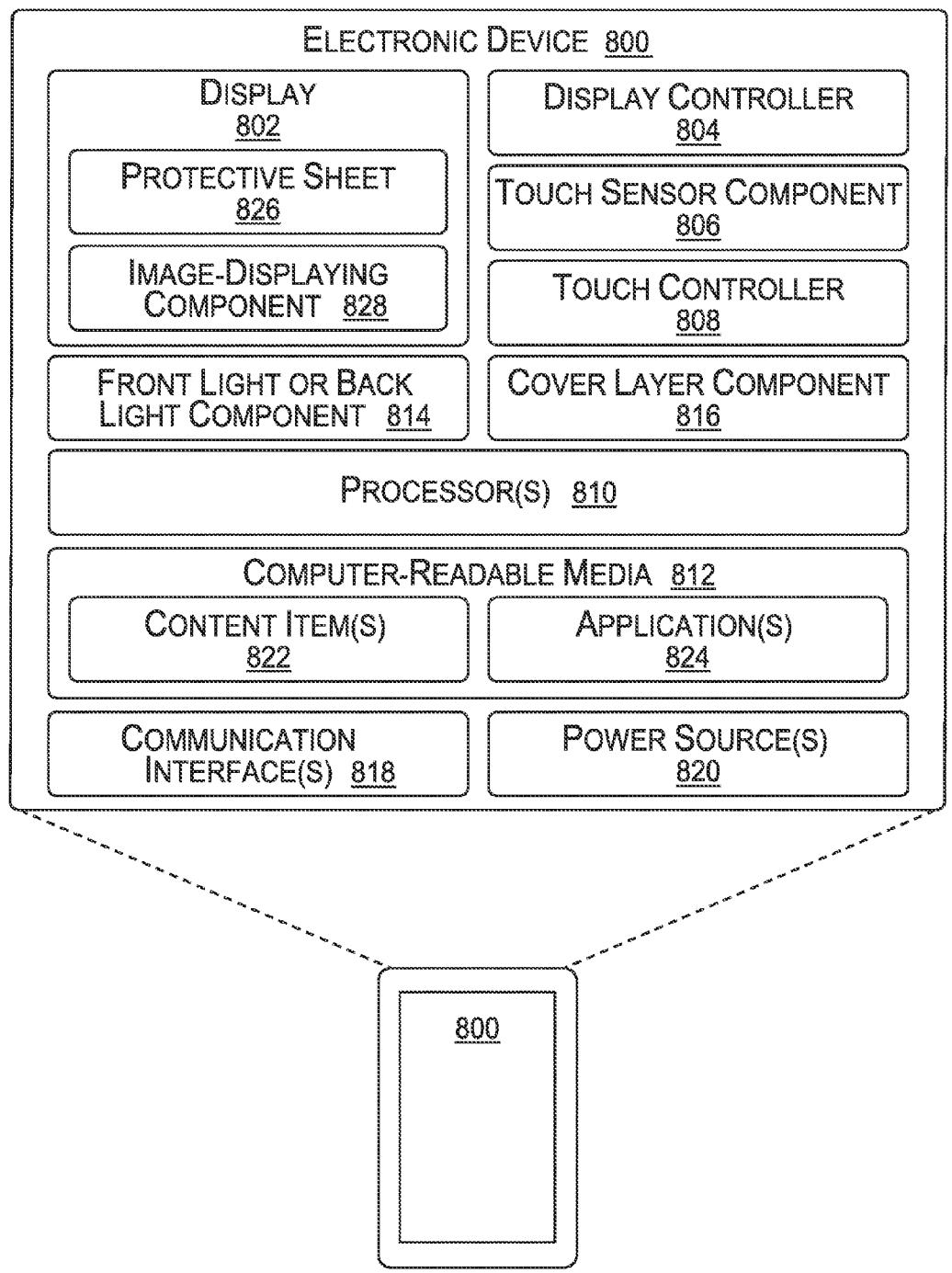
FIG. 8 illustrates an example electronic device that may incorporate a display device, according to various embodiments.

FIG. 8 illustrates an example electronic device 800 that may incorporate any of the display devices discussed above. Electronic device 800 may comprise any type of electronic device having a display. For instance, electronic device 800 may be a mobile electronic device (e.g., an electronic book reader, a tablet computing device, a laptop computer, a smart phone or other multifunction communication device, a portable digital assistant, a wearable computing device, or an automotive display). Alternatively, electronic device 800 may be a non-mobile electronic device (e.g., a computer display or a television). In addition, while FIG. 8 illustrates several example components of electronic device 800, it is to be appreciated that electronic device 800 may also include other conventional components, such as an operating system, system busses, input/output components, and the like. Further, in other embodiments, such as in the case of a television or computer monitor, electronic device 800 may only include a subset of the components illustrated.

Regardless of the specific implementation of electronic device 800, electronic device 800 includes a display 802 and a corresponding display controller 804. The display 802 may represent a reflective or transmissive display in some instances or, alternatively, a transflective display (partially transmissive and partially reflective).

In one embodiment, display 802 comprises an electrowetting display that employs an applied voltage to change the surface tension of a fluid in relation to a surface. For example, such an electrowetting display may include the array of pixels 100 illustrated in FIG. 1, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 802 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, display 802 may represent a backlit display, examples of which are mentioned above.

In addition to including display 802, FIG. 8 illustrates that some examples of electronic device 800 may include a touch sensor component 806 and a touch controller 808. In some instances, at least one touch sensor component 806 resides with, or is stacked on, display 802 to form a touch-sensitive display. Thus, display 802 may be capable of both accepting user touch input and rendering content in response to or corresponding to the touch input. As several examples, touch sensor component 806 may comprise a capacitive touch sensor, a force sensitive resistance (FSR), an interpolating force sensitive resistance (IFSR) sensor, or any other type of touch sensor. In some instances, touch sensor component 806 is capable of detecting touches as well as determining an amount of pressure or force of these touches.

FIG. 8 further illustrates that electronic device 800 may include one or more processors 810 and one or more computer-readable media 812, as well as a front light component 814 (which may alternatively be a backlight component in the case of a backlit display) for lighting display 802, a cover layer component 816, such as a cover glass or cover sheet, one or more communication interfaces 818 and one or more power sources 820. The communication interfaces 818 may support both wired and wireless connection to various networks, such as cellular networks, radio, WiFi networks, short range networks (e.g., Bluetooth®), and infrared (IR) networks, for example.

Depending on the configuration of electronic device 800, computer-readable media 812 (and other computer-readable media described throughout) is an example of computer storage media and may include volatile and nonvolatile memory. Thus, computer-readable media 812 may include, without limitation, RAM, ROM, EEPROM, flash memory, and/or other memory technology, and/or any other suitable medium that may be used to store computer-readable instructions, programs, applications, media items, and/or data which may be accessed by electronic device 800.

Computer-readable media 812 may be used to store any number of functional components that are executable on processor 810, as well as content items 822 and applications 824. Thus, computer-readable media 812 may include an operating system and a storage database to store one or more content items 822, such as eBooks, audio books, songs, videos, still images, and the like. Computer-readable media 812 of electronic device 800 may also store one or more content presentation applications to render content items on electronic device 800. These content presentation applications may be implemented as various applications 824 depending upon content items 822. For instance, the content presentation application may be an electronic book reader application for rending textual electronic books, an audio player for playing audio books or songs, or a video player for playing video.

In some instances, electronic device 800 may couple to a cover (not illustrated in FIG. 8) to protect the display 802 (and other components in the display stack or display assembly) of electronic device 800. In one example, the cover may include a back flap that covers a back portion of electronic device 800 and a front flap that covers display 802 and the other components in the stack. Electronic device 800 and/or the cover may include a sensor (e.g., a Hall effect sensor) to detect whether the cover is open (i.e., if the front flap is not atop display 802 and other components). The sensor may send a signal to front light component 814 if the cover is open and, in response, front light component 814 may illuminate display 802. If the cover is closed, meanwhile, front light component 814 may receive a signal indicating that the cover has closed and, in response, front light component 814 may turn off.

Furthermore, the amount of light emitted by front light component 814 may vary. For instance, upon a user opening the cover, the light from the front light may gradually increase to its full illumination. In some instances, electronic device 800 includes an ambient light sensor (not illustrated in FIG. 8) and the amount of illumination of front light component 814 may be based at least in part on the amount of ambient light detected by the ambient light sensor. For example, front light component 814 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 802 may vary depending on whether front light component 814 is on or off, or based on the amount of light provided by front light component 814. For instance, electronic device 800 may implement a larger default font or a greater contrast when the light is off compared to when the light is on. In some embodiments, electronic device 800 maintains, if the light is on, a contrast ratio for display 802 that is within a certain defined percentage of the contrast ratio if the light is off.

As described above, touch sensor component 806 may comprise a capacitive touch sensor that resides atop display 802. In some examples, touch sensor component 806 may be formed on or integrated with cover layer component 816. In other examples, touch sensor component 806 may be a separate component in the stack of the display assembly. Front light component 814 may reside atop or below touch sensor component 806. In some instances, either touch sensor component 806 or front light component 814 is coupled to a top surface of a protective sheet 826 of display 802. As one example, front light component 814 may include a lightguide sheet and a light source (not illustrated in FIG. 8). The lightguide sheet may comprise a substrate (e.g., a transparent thermoplastic such as PMMA or other acrylic), a layer of lacquer and multiple grating elements formed in the layer of lacquer that function to propagate light from the light source towards display 802; thus, illuminating display 802.

Cover layer component 816 may include a transparent substrate or sheet having an outer layer that functions to reduce at least one of glare or reflection of ambient light incident on electronic device 800. In some instances, cover layer component 816 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3$h$ pencil). Without such scratch resistance, a device may be more easily scratched and a user may perceive the scratches from the light that is dispersed over the top of the reflective display. In some examples, protective sheet 826 may include a similar UV-cured hard coating on the outer surface. Cover layer component 816 may couple to another component or to protective sheet 826 of display 802. Cover layer component 816 may, in some instances, also include a UV filter, a UV-absorbing dye, or the like, for protecting components lower in the stack from UV light incident on electronic device 800. In still other examples, cover layer component 816 may include a sheet of high-strength glass having an antiglare and/or antireflective coating.

Display 802 includes protective sheet 826 overlying an image-displaying component 828. For example, display 802 may be preassembled to have protective sheet 826 as an outer surface on the upper or image-viewing side of display 802. Accordingly, protective sheet 826 may be integral with and may overlay image-displaying component 828. Protective sheet 826 may be optically transparent to enable a user to view, through protective sheet 826, an image presented on image-displaying component 828 of display 802.

In some examples, protective sheet 826 may be a transparent polymer film in the range of 25 to 200 micrometers in thickness. As several examples, protective sheet 826 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 826 may include a coating, such as the hard coating described above. For instance, the hard coating may be applied to the outer surface of protective sheet 826 before or after assembly of protective sheet 826 with image-displaying component 828 of display 802. In some examples, the hard coating may include a photoinitiator or other reactive species in its composition, such as for curing the hard coating on protective sheet 826. Furthermore, in some examples, protective sheet 826 may be dyed with a UV-light-absorbing dye, or may be treated with other UV-absorbing treatment. For example, protective sheet 826 may be treated to have a specified UV cutoff such that UV light below a cutoff or threshold wavelength is at least partially absorbed by protective sheet 826, thereby protecting image-displaying component 828 from UV light.

According to some embodiments herein, one or more of the components discussed above may be coupled to display 802 using fluid optically-clear adhesive (LOCA). For example, the light guide portion of front light component 814 may be coupled to display 802 by placing LOCA on the outer or upper surface of protective sheet 826. If the LOCA reaches the corner(s) and/or at least a portion of the perimeter of protective sheet 826, UV-curing may be performed on the LOCA at the corners and/or the portion of the perimeter. Thereafter, the remaining LOCA may be UV-cured and front light component 814 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 814. In other embodiments, the LOCA may be placed near a center of protective sheet 826, and pressed outwards towards a perimeter of the top surface of protective sheet 826 by placing front light component 814 on top of the LOCA. The LOCA may then be cured by directing UV light through front light component 814. As discussed above, and as discussed additionally below, various techniques, such as surface treatment of the protective sheet, may be used to prevent discoloration of the LOCA and/or protective sheet 826.

While FIG. 8 illustrates a few example components, electronic device 800 may have additional features or functionality. For example, electronic device 800 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 800 may reside remotely from electronic device 800 in some implementations. In these implementations, electronic device 800 may utilize communication interfaces 818 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
 a first support plate and a second support plate;
 a first fluid and a second fluid that is immiscible with the first fluid, the first fluid and the second fluid between the first support plate and the second support plate;
 a plurality of pixel walls formed on the first support plate, each pixel wall in the plurality of pixel walls having first and second side surfaces, each of the first and second side surfaces of each pixel wall in the plurality of pixel walls being concave and curvilinear, the plurality of pixel walls being associated with a plurality of electrowetting pixels; and
 a pixel electrode disposed on the first support plate for applying a voltage within each electrowetting pixel of the plurality of electrowetting pixels to cause relative displacement of the first fluid and the second fluid, wherein at least partly in response to the voltage being applied to the pixel electrode, a portion of the first fluid or the second fluid forms a droplet against the first or second side surface of one of the plurality of pixel walls.

2. The electrowetting display device of claim 1, wherein each of the first and second side surfaces of each pixel wall in the plurality of pixel walls is concave with respect to a plane extending through the pixel wall perpendicular to a top surface of the first support plate.

3. The electrowetting display device of claim 1, wherein each of the first and second side surfaces of each pixel wall in the plurality of pixel walls is substantially symmetrical about a plane extending along a length of the pixel wall perpendicular to a top surface of the first support plate.

4. A display device, comprising:
 a first support plate having a top surface; and
 a wall on the first support plate, the wall having an end surface and a midpoint between the end surface and the top surface, the wall having a first width at the end surface and a second width less than the first width at the midpoint, a portion of the wall associated with an electrowetting pixel, a first side surface of the portion of the wall facing the electrowetting pixel being at least partially concave, wherein a first fluid disposed within the electrowetting pixel contacts the first side surface.

5. The display device of claim 4, wherein the electrowetting pixel comprises a pixel electrode disposed on the first support plate for applying a voltage within the electrowetting pixel to cause relative displacement of the first fluid and a second fluid disposed within the electrowetting pixel.

6. The display device of claim 5, further comprising a second wall on the first support plate, the second wall associated with the electrowetting pixel and having planar side surfaces, wherein at least partly in response to the voltage being applied to pixel electrode, a portion of the first fluid or the second fluid moves towards the first side surface of the portion of the wall and away from the second wall.

7. The display device of claim 4, wherein the first side surface includes a planar surface, the planar surface being perpendicular to the first support plate.

8. The display device of claim 7, wherein the planar surface extends from a top of the first side surface to a midpoint of the first side surface between the top of the first side surface and the top surface of the first support plate.

9. The display device of claim 7, wherein the planar surface extends from the top surface of the first support plate to a midpoint of the first side surface between a top of the first side surface and the top surface of the first support plate.

10. The display device of claim 4, wherein the portion of the wall further comprises a second side surface opposing the first side surface, wherein the second side surface is associated with an additional pixel and is at least partially concave.

11. The display device of claim 4, wherein the first side surface is concave with respect to a plane extending through the wall and perpendicular to the top surface of the first support plate.

12. The display device of claim 4, wherein the portion of the wall further comprises a second side surface of the portion of the wall opposing the first side surface and the first side surface of the portion of the wall and the second side surface of the portion of the wall are substantially symmetrical about a plane oriented along a length of the wall perpendicular to the first support plate.

13. The display device of claim 4, further comprising a second support plate parallel to the first support plate, the second support plate including a spacer protruding from the second support plate toward the end surface of the wall.

14. The display device of claim 13, wherein the spacer is in contact with the end surface of the wall.

15. The display device of claim 4, wherein the first width is between about 2 micrometers and about 6 micrometers.

16. The display device of claim 15, wherein the second width is between about 1 micrometer and about 2 micrometers, and a height of the wall is between about 2 micrometers and about 6 micrometers.

17. A method for fabricating at least a portion of an electrowetting display device, the method comprising:
depositing a photoresist over a surface of a support plate;
positioning a diffractive mask over the support plate, the diffractive mask including a pattern of non-transparent material configured to disperse light passing through the diffractive mask; and
patterning the photoresist through the diffractive mask to cure a portion of the photoresist into a pixel wall having a concave side surface.

18. The method of claim 17, further comprising:
depositing a second photoresist over the support plate; and
patterning the second photoresist to form at least a portion of the pixel wall with a reflective surface positioned underneath the support plate.

19. The method of claim 17, wherein patterning the photoresist comprises patterning the photoresist to form a plurality of pixel walls associated with individual electrowetting pixels.

20. The method of claim 17, further comprising mounting a second support plate parallel to the support plate, the second support plate including a spacer protruding from the second support plate toward a top surface of the wall.

21. The method of claim 20, wherein mounting the second support plate comprises positioning the spacer in contact with the top surface of the pixel wall.

22. A display device, comprising:
a first support plate having a first surface; and
a wall on the first surface, the wall having a first width at a top surface of the wall and a second width less than the first width at a point between the top surface and the first surface, a portion of the wall associated with an electrowetting pixel, a first side surface of the portion of the wall facing the electrowetting pixel being at least partially concave, wherein a first fluid disposed within the electrowetting pixel contacts the first side surface.

* * * * *